(12) United States Patent
Chakraborty et al.

(10) Patent No.: US 12,334,819 B2
(45) Date of Patent: Jun. 17, 2025

(54) COMPENSATION SLOPE ADJUSTMENT IN VOLTAGE CONVERTER

(71) Applicant: TEXAS INSTRUMENTS INCORPORATED, Dallas, TX (US)

(72) Inventors: Sombuddha Chakraborty, Redwood City, CA (US); Raveesh Magod Ramakrishna, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 82 days.

(21) Appl. No.: 17/390,015

(22) Filed: Jul. 30, 2021

(65) Prior Publication Data

US 2023/0031749 A1 Feb. 2, 2023

(51) Int. Cl.
*H02M 3/156* (2006.01)
*H03K 3/037* (2006.01)
*H03F 3/45* (2006.01)

(52) U.S. Cl.
CPC ............ *H02M 3/156* (2013.01); *H03K 3/037* (2013.01); *H03F 3/45475* (2013.01)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/421; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/157; H02M 3/158; H02M 3/1588; H02M 2003/1566; H02M 3/1582; H02M 3/1584; H02M 2003/1557;

(Continued)

(56) References Cited

U.S. PATENT DOCUMENTS 6,297,621 B1 * 10/2001 Hui ..................... H02M 1/4225
323/283
7,372,241 B1 * 5/2008 Tomiyoshi .......... H02M 3/1588
323/283

(Continued)

*Primary Examiner* — Jeffrey A Gblende
(74) *Attorney, Agent, or Firm* — Frank D. Cimino

(57) ABSTRACT

A method includes receiving a first indication of an inductor current provided by a voltage converter. The method also includes, responsive to a ratio of a rate of change of the first indication to a rate of change of a compensation ramp being greater than a threshold value, providing a second indication to the ramp generator. The compensation ramp is provided by a ramp generator to control the voltage converter. The second indication is configured to cause the ramp generator to increase an absolute value of the rate of change of the compensation ramp. The method also includes, responsive to the ratio being less than the threshold value, providing a third indication to the ramp generator. The third indication is configured to cause the ramp generator to decrease the absolute value of the rate of change of the compensation ramp.

24 Claims, 5 Drawing Sheets

(58) Field of Classification Search
CPC .... H02M 1/032; H02M 1/4225; H02M 7/217; H05B 39/048; B23K 11/24; H04B 2215/069
See application file for complete search history.

(56) References Cited

U.S. PATENT DOCUMENTS

| | | | |
|---|---|---|---|
| 8,541,993 B2* | 9/2013 | Notman | H02M 3/1588 |
| | | | 323/287 |
| 9,425,688 B2* | 8/2016 | Ouyang | H02M 3/156 |
| 9,853,548 B1* | 12/2017 | Zhang | H02M 1/08 |
| 11,381,167 B2* | 7/2022 | Munroe | H02M 3/157 |
| 2021/0351687 A1* | 11/2021 | Fang | H02M 3/156 |

* cited by examiner

COMPENSATION SLOPE ADJUSTMENT IN VOLTAGE CONVERTER

BACKGROUND

Voltage converters convert an input voltage into an output voltage that may be different than the input voltage. Boost converters provide step-up conversion in which the output voltage is greater than the input voltage. Buck converters provide step-down conversion in which the output voltage is less than the input voltage. In both buck and boost converter topologies, an inductor is coupled to a power switch (e.g., a field-effect transistor (FET)). The power FET is turned ON and OFF to store energy in the inductor or transfer energy stored in the inductor to a load coupled to the voltage converter. Adaptive on/off time current control schemes for voltage converters control the switching of the power FET responsive to a comparison of a current through the inductor to a threshold (e.g., a current peak or current valley threshold, based on a compensation ramp provided by a ramp generator) and to a clock signal (e.g., the occurrence of a clock edge).

SUMMARY

In an example of the description, a method includes receiving a first indication of an inductor current provided by a voltage converter. The method also includes, responsive to a ratio of a rate of change of the first indication to a rate of change of a compensation ramp being greater than a threshold value, providing a second indication to the ramp generator. The compensation ramp is provided by a ramp generator to control the voltage converter. The second indication is configured to cause the ramp generator to increase an absolute value of the rate of change of the compensation ramp. The method also includes, responsive to the ratio being less than the threshold value, providing a third indication to the ramp generator. The third indication is configured to cause the ramp generator to decrease the absolute value of the rate of change of the compensation ramp.

In another example of the description, a device includes a sample and hold (SH) circuit configured to receive a first indication of an inductor current provided by a voltage converter, and provide a second indication of a rate of change of the first indication. The device also includes an integrator circuit coupled to the SH circuit. The integrator circuit is configured to receive the second indication, and receive a third indication of a rate of change of a compensation ramp. The compensation ramp is provided by a ramp generator to control the voltage converter. Responsive to a ratio of the second indication to the third indication being greater than a threshold value, the integrator circuit is configured to provide a fourth indication to the ramp generator, to cause the ramp generator to increase an absolute value of the rate of change of the compensation ramp. Responsive to the ratio being less than the threshold value, the integrator circuit is configured to provide a fifth indication to the ramp generator, to cause the ramp generator to decrease the absolute value of the rate of change of the compensation ramp.

In yet another example of the description, a device includes a first sample and hold (SH) circuit having a first SH circuit output, and first SH circuit first and second inputs. The first SH circuit first input is adapted to be coupled to an inductor current sense circuit output, and the first SH circuit second input is adapted to be coupled to a timing circuit first output. The device also includes a second SH circuit having a second SH circuit output, and second SH circuit first and second inputs. The second SH circuit first input is coupled to the first SH circuit first input, and the second SH circuit second input is adapted to be coupled to a timing circuit second output. The device also includes a differential amplifier having a differential amplifier output, an inverting input, and a non-inverting input. The inverting input is coupled to the second SH circuit output, and the non-inverting input is coupled to the first SH circuit output. The device also includes a capacitor having a first terminal and a second terminal, where the first terminal is coupled to a ground terminal. The device includes a current source coupled to the second terminal. The device also includes an integrator circuit having an integrator circuit output, and integrator circuit first and second inputs. The integrator circuit first input is coupled to the differential amplifier output, and the integrator circuit second input is coupled to the second terminal. The integrator circuit output is configured to control a slope of a compensation ramp provided by a ramp generator.

DETAILED DESCRIPTION

Figure 1:
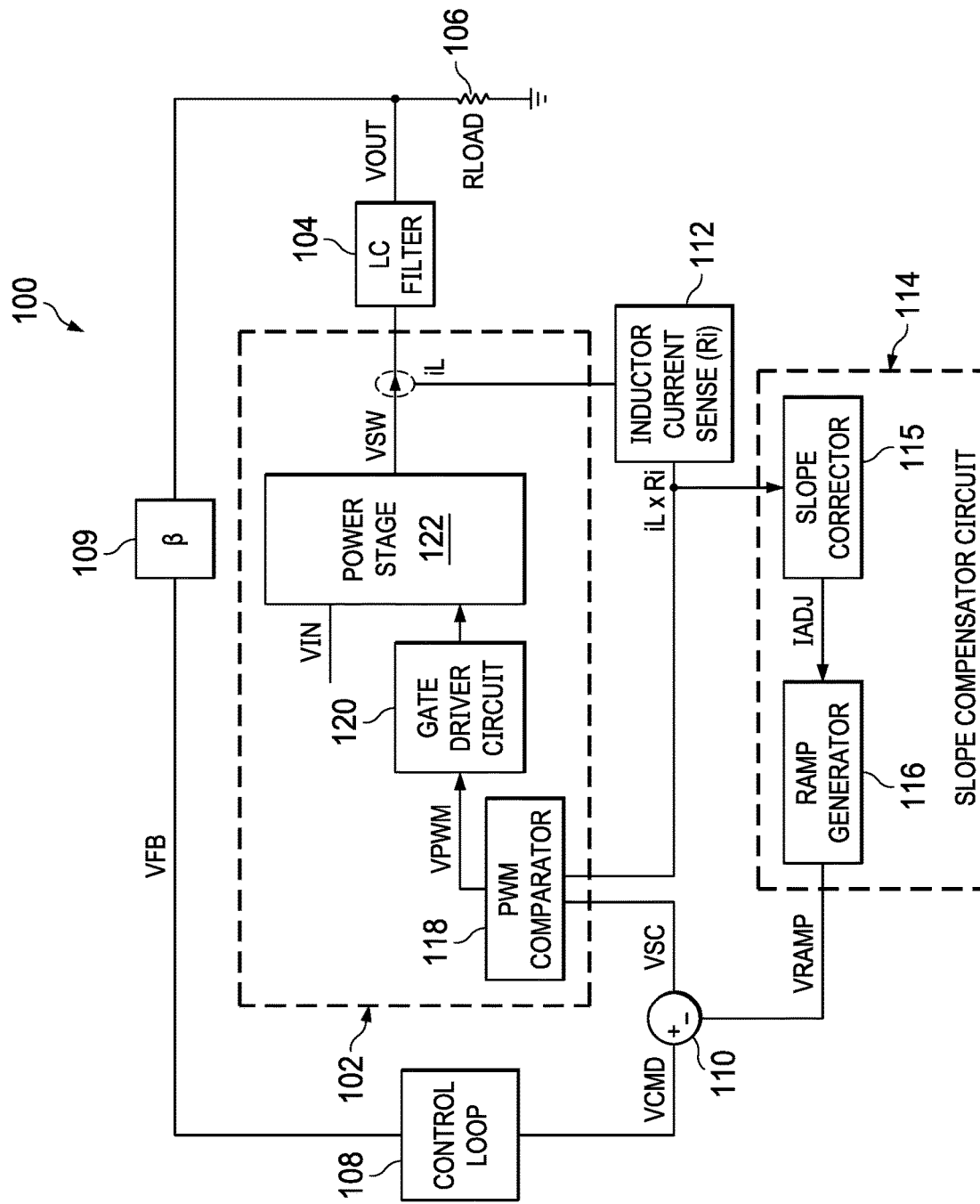
FIG. 1 is a block diagram of a system including a slope compensator circuit in various examples.

As described, control schemes for voltage converters include controlling the switching of the voltage converter (e.g., power FETs of the voltage converter) responsive to a comparison of an inductor current to a threshold (e.g., a current peak or current valley threshold, based on a compensation ramp provided by a ramp generator). For ease of description, a rising slope of the inductor current is indicated as M1, while a falling slope of the inductor current is indicated as M2. A slope of the compensation ramp provided by the ramp generator is indicated as M3. In a voltage converter that is controlled using peak current-mode (PCM) control, maintaining a relationship between M2 and M3 (e.g., a particular ratio) is useful. Similarly, in a voltage controller that is controlled using valley current-mode (VCM) control, maintaining a relationship between M1 and M3 (e.g., a particular ratio) is useful. However, in the PCM control case, M2 varies responsive both to changes in voltage converter input voltage (VIN) and/or output voltage (VOUT), as well as to variances in the value of the inductor. Similarly, in the VCM control case, M1 varies responsive both to changes in VIN and/or VOUT, as well as to variances in the value of the inductor.

To address these problems, examples described below are directed to a slope compensator circuit including a sample and hold (SH) circuit that is configured to receive an indication of the inductor current. In some examples, the indication of the inductor current is a voltage that is proportional to the inductor current, such as a voltage across a sense resistor. The SH circuit is also configured to provide an indication of a rate of change of the inductor current (e.g., an indication of M1 or M2). For example, the SH circuit is configured to sample the inductor current at a first time, and at a second time. In this example, the indication of the rate of change of the inductor current is the difference between the inductor current at the first and second times.

The slope compensator circuit also includes an integrator circuit that is coupled to the SH circuit. The integrator circuit is configured to receive the indication of the rate of change of the inductor current from the SH circuit. The integrator circuit is also configured to receive an indication of a rate of change of the compensation ramp provided by the ramp generator (e.g., an indication of M3). As described below, the ramp generator provides the compensation ramp by charging a capacitor with a current source. In this example, a replica of the current source and capacitor of the ramp generator are coupled to the integrator circuit, and the indication of the rate of change of the compensation ramp is the voltage across the replica capacitor.

The integrator circuit is configured to compare the rate of change of the inductor current (M1 or M2) to the rate of change of the compensation ramp (M3). The integrator circuit is configured to cause the ramp generator to increase an absolute value of the rate of change of the compensation ramp, or M3, responsive to a ratio of M1 or M2 to M3 being greater than a threshold value, which indicates that the rate of change of the compensation ramp is less than specified for a given application (e.g., M3 is shallower relative to M1 or M2 than specified). The integrator circuit is configured to cause the ramp generator to decrease the absolute value of the rate of change of the compensation ramp, or M3, responsive to a ratio of M1 or M2 to M3 being less than the threshold value, which indicates that the rate of change of the compensation ramp is greater than specified for a given application (e.g., M3 is steeper relative to M1 or M2 than specified).

In the example of PCM control, in which M2 is compared to M3, both M2 and M3 are negative values. Accordingly, increasing the absolute value of M3 corresponds to increasing the slope of the compensation ramp in the negative direction, while decreasing the absolute value of M3 corresponds to decreasing the slope of the compensation ramp in the negative direction. In the example of VCM control, in which M1 is compared to M3, both M1 and M3 are positive values. Accordingly, increasing the absolute value of M3 corresponds to increasing the slope of the compensation ramp in the positive direction, while decreasing the absolute value of M3 corresponds to decreasing the slope of the compensation ramp in the positive direction.

The threshold value to which the ratio of M1 or M2 to M3 is compared is determined based on a gain implemented by the slope compensator circuit. In one example, the threshold value is in the range such that M3 is between approximately 0.5*M2 (or M1) and 1.3*M2 (or M1), which is described below. Accordingly, examples of this description vary M3 responsive to variances to M1 or M2, irrespective of whether those variances are due to VIN and/or VOUT changing, due to environmental impacts on component (e.g., inductor) values, or due to manufacturing variances in component (e.g., inductor) values. These and other examples are described below, with reference to the accompanying figures.

FIG. 1 is a block diagram of a system 100 in accordance with examples of this description. The system 100 includes a voltage converter 102, which is configured to convert an input voltage (VIN) to an output voltage (VOUT). An inductor-capacitor (LC) filter 104 is coupled to the voltage converter 102, such as to a switch node of the voltage converter 102, the voltage at which is labeled VSW. The LC filter 104 is configured to transfer a switched output of the voltage converter 102 to provide a filtered (e.g., averaged) VOUT to a load 106, which is represented by a resistor in FIG. 1.

The system 100 also includes a control loop 108, which is adapted to be coupled to the load 106, and thus receives VOUT. The control loop 108 is configured to regulate the operation of the voltage converter 102 to provide a VOUT value specified for a given application. In some examples, the control loop 108 includes a beta network 109, which is programmable (e.g., digitally programmable) and specifies or indicates a value to which VOUT is regulated by the control loop 108 and the voltage converter 102. The beta network 109 transforms VOUT into a feedback voltage, labeled VFB in FIG. 1, such as responsive to a programmed beta value implemented by the beta network 109. The control loop 108 in turn transforms VFB into a command signal or voltage, labeled VCMD in FIG. 1. VCMD varies with respect to VOUT and, in the example of FIG. 1, is provided to a non-inverting terminal of an analog subtractor 110.

The system 100 also includes an inductor current sense circuit 112, which is configured to provide an indication of the current through the inductor of the LC filter 104 (e.g., the current having a value iLL). In one example, the inductor current sense circuit 112 includes a sense resistor (e.g., having a resistance Ri) coupled to the inductor, and the indication of the inductor current is a voltage across the sense resistor, which is proportional to the inductor current (e.g., iL×Ri).

The indication of the inductor current is provided by the inductor current sense circuit 112 to a slope compensator circuit 114. Generally, the slope compensator circuit 114 (e.g., a slope corrector 115 of the slope compensator circuit 114) determines the rate of change of the inductor current (e.g., M1 or M2) based on the indication of inductor current provided by the inductor current sense circuit 112. The slope compensator circuit 114 also compares M1 or M2 to the rate of change of the compensation ramp (the voltage of which is labeled VRAMP in FIG. 1) provided by ramp generator 116 (e.g., M3). The slope compensator circuit 114 is configured to cause the ramp generator 116 to increase an absolute value of the rate of change of VRAMP, or M3, responsive to a ratio of M1 or M2 to M3 being greater than a threshold value. The slope compensator circuit 114 is configured to cause the ramp generator 116 to decrease the absolute value of the rate of change of VRAMP, or M3, responsive to a ratio of M1 or M2 to M3 being less than the threshold value. In an example, the slope corrector 115, provides an adjusted current indication (IADJ) to the ramp generator 116, which either increases or decreases a current used by the ramp generator 116 to provide VRAMP. For example, a negative value of IADJ sinks a proportional amount of current from the current used by the ramp generator 116 to provide VRAMP, which decreases the slope of VRAMP (e.g., M3). Similarly, a positive value of IADJ adds a proportional amount of current to the current used by the ramp generator 116 to provide VRAMP, which increases the slope of VRAMP (e.g., M3). The slope compensator circuit 114 is described below.

The compensation ramp provided by the ramp generator 116 is provided to an inverting terminal of the subtractor 110, such as responsive to PCM control being implemented to control the voltage converter 102. For example, as VRAMP increases (e.g., due to a current source of the ramp generator 116 charging a capacitor of the ramp generator 116), the output of the subtractor 110 (the voltage of which is labeled VSC in FIG. 1) decreases, such as from the level of VCMD provided by the control loop 108 responsive to the value of VOUT. In another example in which VCM control is implemented to control the voltage converter 102, the subtractor 110 is replaced with an adder, which is not shown for simplicity. In the VCM control example, as VRAMP increases, the output of the adder also increases, such as from the level of VCMD provided by the control loop 108 responsive to the value of VOUT.

The output of the subtractor 110, as well as the indication of the inductor current from the inductor current sense circuit 112, are provided to a pulse-width modulation (PWM) comparator 118 of the voltage converter 102. The PWM comparator 118 is configured to provide a PWM signal (the voltage of which is labeled VPWM in FIG. 1). In the PCM control example, the PWM comparator 118 is configured to assert VPWM responsive to the sensed inductor current being greater than the slope-compensated output of subtractor 110 (e.g., VSC). In the VCM control example, the PWM comparator 118 is configured to assert VPWM responsive to the sensed inductor current being less than VSC. A gate driver circuit 120 receives VPWM from the PWM comparator 118. The gate driver circuit 120 is configured to control the operation of a power stage 122 of the voltage converter 102. In an example, the power stage 122 includes a high-side power FET and a low-side power FET, and the gate driver circuit 120 is configured to provide control signals to gates or control terminals of each of the power FETs.

Figure 2:
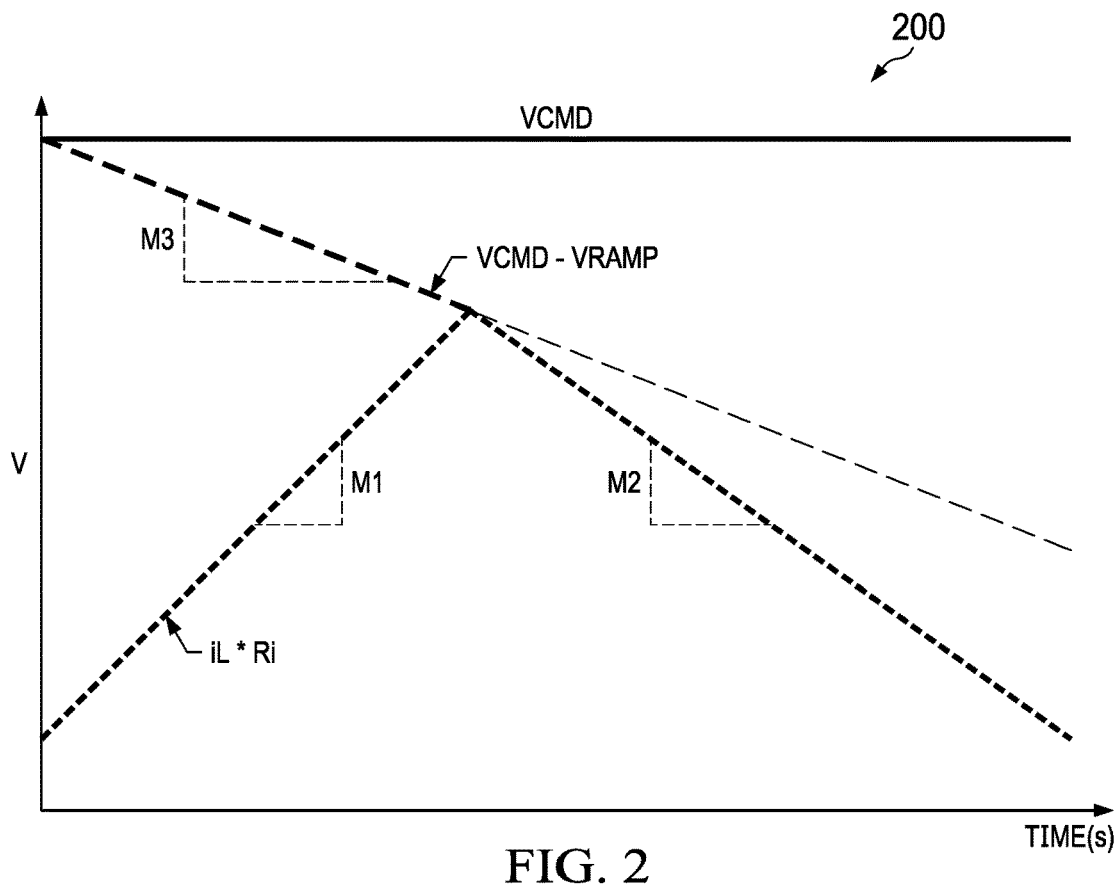
FIG. 2 is a graph of waveforms demonstrating operation of certain elements of the system of FIG. 1.

FIG. 2 is a graph 200 of waveforms demonstrating operation of certain elements of the system 100 of FIG. 1 using a PCM control scheme to control the voltage converter 102. In particular, the graph 200 includes a waveform, labeled iL*Ri, that is an indication of inductor current, such as a voltage provided by the inductor current sense circuit 112 (e.g., iL×Ri). The graph 200 shows the relationship between the waveform, the voltage output by the control loop 108 (e.g., VCMD), and the output of the subtractor 110 (e.g., VSC, or VCMD−VRAMP). As described above, the compensation ramp provided by the ramp generator 116 is a component of the output of the subtractor 110. As above, M1 refers to the rising slope of the inductor current, M2 refers to the falling slope of the inductor current, and M3 refers to the slope of the compensation ramp (VSC).

In the example of FIG. 2, the ratio of M2 to M3 is compared to a threshold value, which is determined based on a gain implemented by the slope compensator circuit 114. In this particular example, the threshold value is in the range such that M3 adjusted or compensated (e.g., by the slope corrector 115 causing the ramp generator 116 to vary VRAMP) to be shallower than M2, or approximately equal to 0.65*M2. For example, responsive to the ratio of M2 to M3 being greater than a threshold value, which indicates that the rate of change of the compensation ramp (VSC) is less than specified for a given application (e.g., M3 is shallower than 0.65*M2), the slope corrector 115 causes the ramp generator 116 to increase an absolute value of the rate of change of VRAMP, which in turn causes M3 to be steeper. Responsive to the ratio of M2 to M3 being less than the threshold value, which indicates that the rate of change of the compensation ramp (VSC) is greater than specified for a given application (e.g., M3 is steeper than 0.65*M2), the slope corrector 115 causes the ramp generator 116 to decrease the absolute value of the rate of change of VRAMP, which in turn causes M3 to be shallower. Accordingly, examples of this description vary M3 responsive to variances to M2 (or, in other examples, M1), irrespective of whether those variances are due to VIN and/or VOUT changing, due to environmental impacts on component (e.g., inductor) values, or due to manufacturing variances in component (e.g., inductor) values.

Figure 3:
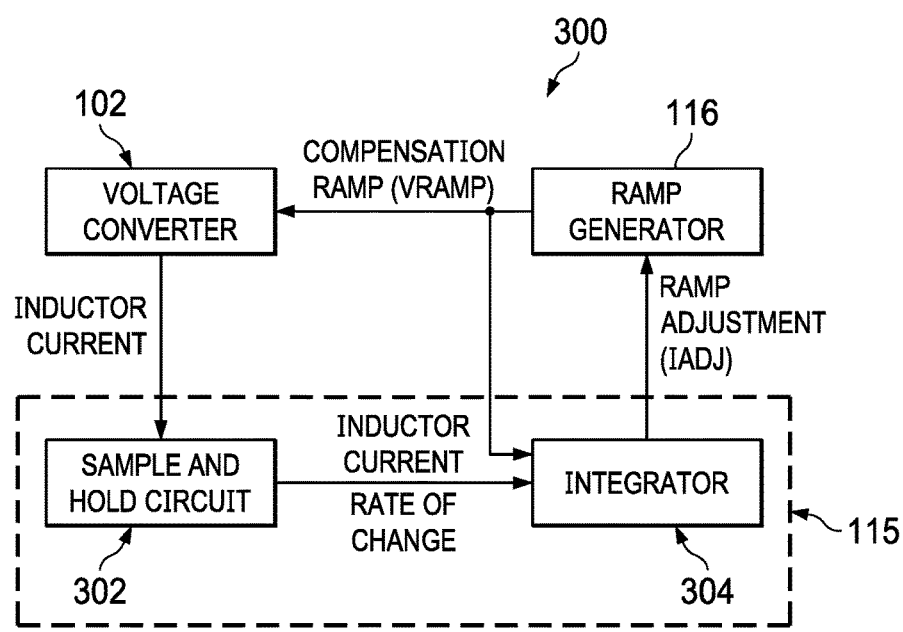
FIG. 3 is a block diagram of a system including detail of the slope compensator circuit of FIG. 1 in various examples.

FIG. 3 is a block diagram of a system 300 including detail of the slope corrector 115 and the slope compensator circuits 114 described above. In the system 300, the indication of inductor current (e.g., a voltage equivalent that is proportional to the inductor current) is schematically shown as provided by the voltage converter 102 to an SH circuit 302 of the slope corrector 115. In the example of FIG. 3, the SH circuit 302 thus receives the indication of inductor current provided by the voltage converter 102. The SH circuit 302 is configured to provide an indication of a rate of change of the inductor current (e.g., an indication of M1 or M2) to an integrator circuit 304 of the slope corrector 115.

The integrator circuit 304 also receives an indication of a rate of change of VRAMP (e.g., an indication of M3) that is provided by the ramp generator 116. The integrator circuit 304 is configured to compare the rate of change of the inductor current (M1 or M2) to the rate of change of VRAMP (M3), such as to determine a ratio of M1 or M2 to M3.

The integrator circuit 304 is configured to cause the ramp generator 116 to increase an absolute value of the rate of change of VRAMP, or M3, responsive to a ratio of M1 or M2 to M3 being greater than a threshold value, which indicates that the rate of change of VRAMP is less than specified for a given application (e.g., M3 is shallower relative to M1 or M2 than specified). The integrator circuit 304 is configured to cause the ramp generator 116 to decrease the absolute value of the rate of change of VRAMP, or M3, responsive to a ratio of M1 or M2 to M3 being less than the threshold value, which indicates that the rate of change of VRAMP is greater than specified for a given application (e.g., M3 is steeper relative to M1 or M2 than specified).

As described above, the integrator circuit 304 compares the ratio of M1 or M2 to M3 to a threshold value. This threshold value is determined based on a gain implemented by the slope compensator circuit 114. In one example, such as shown in FIG. 2, it is useful to maintain M3 to be approximately 0.65*M2 (or 0.65*M1 in a VCM control example), which reduces the likelihood of sub-harmonic oscillation of the voltage converter 102 and/or increases the responsiveness of the voltage converter 102 to adjust to variations, such as to VOUT or VIN, in relatively few cycles of operation.

Figure 4:
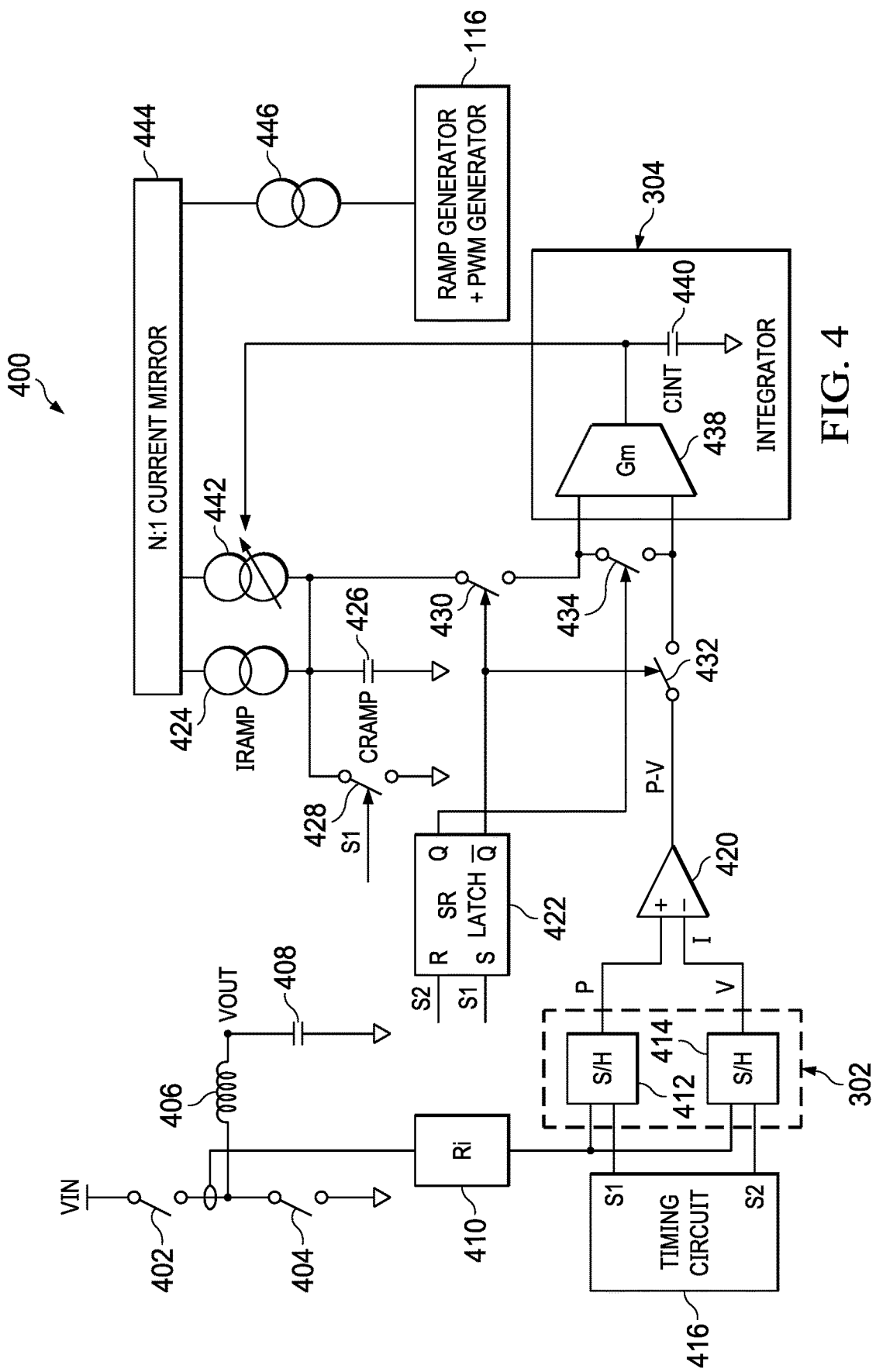
FIG. 4 is a schematic diagram of a system including an analog integrator circuit in various examples.

FIG. 4 is a schematic diagram of a system 400 including an analog integrator circuit 304 in various examples. The system 400 includes details of various elements described above. For example, the power stage 122 of the voltage converter 102 is represented by a high-side power FET 402 and a low-side power FET 404, while the LC filter 104 is represented by an inductor 406 and a capacitor 408. The high-side power FET 402 is coupled to a voltage supply terminal (the voltage at which is VIN), while the low-side power FET 404 is coupled to the high-side power FET 402 and to a ground terminal. The inductor 406 is coupled to the high-side power FET 402 and to the low-side power FET 404 (e.g., coupled to a node between the high-side power FET 402 and the low-side power FET 404). The capacitor 408 is coupled to the inductor 406 and to the ground terminal. In this example, the voltage across the capacitor 408 is provided as VOUT. The inductor current sense circuit 112 is represented by a sense resistor 410 (e.g., having a resistance Ri) coupled to the inductor 406. In this example, the indication of the inductor 406 current is a voltage across the sense resistor 410, which is proportional to the inductor 406 current (e.g., iL×Ri).

The SH circuit 302 of FIG. 3 is shown in FIG. 4. In particular, the SH circuit 302 includes a first SH circuit 412 that has first and second inputs and an output. The SH circuit 302 also includes a second SH circuit 414 that has first and second inputs and an output. The first SH circuit 412 first input is adapted to be coupled to the inductor current sense circuit 112, such as to receive the indication of the inductor 406 current (e.g., a voltage across the sense resistor 410). The second SH circuit 414 first input is also adapted to be coupled to the inductor current sense circuit 112, such as to receive the indication of the inductor 406 current (e.g., a voltage across the sense resistor 410). Thus, the second SH circuit 414 first input is coupled to the first SH circuit 412 first input. The first SH circuit 412 second input is adapted to be coupled to an output (S1) of a timing circuit 416. The second SH circuit 414 second input is adapted to be coupled to an output (S2) of the timing circuit 416. The function of the timing circuit 416 is described below.

Each of the first SH circuit 412 and the second SH circuit 414 is configured to sample a voltage provided at the respective first input responsive to a signal edge (e.g., a voltage pulse) being received at the respective second input. The sampled voltage is provided to the output of the respective SH circuit 412, 414, which is "held" at that value until the respective first input is again sampled responsive to a subsequent signal edge being received at the respective second input. The timing circuit 416 is configured to provide a voltage pulse on the S1 output at a first time (t1), and to provide a voltage pulse on the S2 output at a second time (t2) after t1. Accordingly, the SH circuit 302 provides an indication of the rate of change of the inductor 406 current because the first SH circuit 412 samples and provides as its output the inductor 406 current at t1 (e.g., responsive to S1), and the second SH circuit 414 samples and provides as its output the inductor 406 current at t2 (e.g., responsive to S2).

In the example of FIG. 4, the output of the first SH circuit 412 is provided to a non-inverting input of a differential amplifier 420, while the output of the second SH circuit 414 is provided to an inverting input of the differential amplifier 420. The differential amplifier 420 provides an output voltage that is proportional to the difference between its inputs, or the outputs of the first SH circuit 412 and the second SH circuit 414. Accordingly, the output of the differential amplifier 420 is also an indication of the rate of change of the inductor 406 current when the time period between t1 and t2 is considered.

The outputs S1, S2 of the timing circuit 416 are also provided as inputs to a set-reset (SR) latch 422. In particular, S1 is provided to the set (S) input of the SR latch 422, while S2 is provided to the reset (R) input of the SR latch 422. Outputs of the SR latch 422 control various switches in the system 400, which are described below.

The system 400 also includes a replica current source 424 and a replica capacitor 426. As described above, the ramp generator 116 provides VRAMP by a current source of the ramp generator 116 charging a capacitor of the ramp generator 116. The replica current source 424 is a replica of the current source implemented in the ramp generator 116, while the replica capacitor 426 is a replica of the capacitor implemented in the ramp generator 116. The replica capacitor 426 is coupled to the replica current source 424 and to a ground terminal. A switch 428 (e.g., a transistor) is also coupled to a node between the replica current source 424 and the replica capacitor 426, and to the ground terminal. The switch 428 is controlled responsive to S1 from the timing circuit 416. For example, the switch 428 is open responsive to S1 being deasserted, and is closed responsive to S1 being asserted. Accordingly, the switch 428 has a control terminal that is adapted to be coupled to the S1 output from the timing circuit 416. The replica capacitor 426 is charged by the replica current source 424 responsive to the switch 428 being open, and is discharged responsive to the switch 428 being closed. The voltage across the replica capacitor 426 (e.g., the voltage at a compensation ramp node between the replica capacitor 426 and the replica current source 424) over time indicates a rate of change of VRAMP provided by the ramp generator 116.

The system 400 also includes switches 430, 432, 434 (e.g., transistors). The switch 430 is coupled to the compensation ramp node (e.g., between the replica capacitor 426 and the replica current source 424) and to an input of the analog integrator circuit 304. The switch 432 is coupled to the output of the differential amplifier 420 and to another input of the analog integrator circuit 304. The switch 434 is coupled to each of the inputs of the analog integrator circuit 304. The switches 430, 432 are controlled responsive to an inverted output ($\overline{Q}$) of the SR latch 422 (e.g., the switches 430, 432 each has a control terminal coupled to the $\overline{Q}$ output of the SR latch 422), while the switch 434 is controlled responsive to the Q output of the SR latch 422 (e.g., the switch 434 has a control terminal coupled to the Q output of the SR latch 422). For example, responsive to $\overline{Q}$ being asserted, the analog integrator circuit 304 receives the indication of the rate of change of the inductor 406 current from the differential amplifier 420 (e.g., through the switch 432), and the indication of the rate of change of VRAMP (e.g., through the switch 430). Continuing this example, responsive to Q being asserted, the analog integrator circuit 304 inputs are coupled (e.g., through the switch 434), and the analog integrator circuit 304 output does not change, until the next cycle responsive to the SR latch 422 being reset, and $\overline{Q}$ is asserted again.

In the example of FIG. 4, the analog integrator circuit 304 is an analog implementation, and includes a transconductance amplifier 438 and an integrating capacitor 440. The transconductance amplifier 438 includes inputs that are coupled to the inputs of the analog integrator circuit 304. For example, the transconductance amplifier 438 includes an input coupled to the switch 430, and another input coupled to the switch 432. The transconductance amplifier 438 is configured to provide a current at its output that is proportional to a difference between voltages received at the transconductance amplifier 438 inputs. The integrating capacitor 440 is coupled to the transconductance amplifier 438 output and to a ground terminal. Accordingly, the integrating capacitor 440 is charged responsive to the current provided by the transconductance amplifier 438 output. A voltage across the integrating capacitor 440 is thus indicative of a comparison of the transconductance amplifier 438 inputs. The voltage across the integrating capacitor 440 is also the output of the analog integrator circuit 304.

In the example of FIG. 4, the output of the analog integrator circuit 304, or the voltage across the integrating capacitor 440, controls a voltage-controlled current source 442 (e.g., is provided to a control terminal of the voltage-controlled current source 442). The voltage-controlled current source 442 is also coupled to the compensation ramp node between the replica current source 424 and the replica capacitor 426. The replica current source 424 and the voltage-controlled current source 442 are coupled as inputs to a current mirror 444. For example, the sum of the currents provided by the replica current source 424 and the voltage-controlled current source 442 is mirrored at an output of the current mirror 444, which is represented as output current source 446. The output current source 446 is coupled to the ramp generator 116. Accordingly, responsive to the voltage-controlled current source 442 providing current to (or sinking current from) the compensation ramp node, a corresponding current is provided to (or sunk from) the ramp generator 116 to alter the slope of VRAMP provided by the ramp generator 116.

Figure 5:
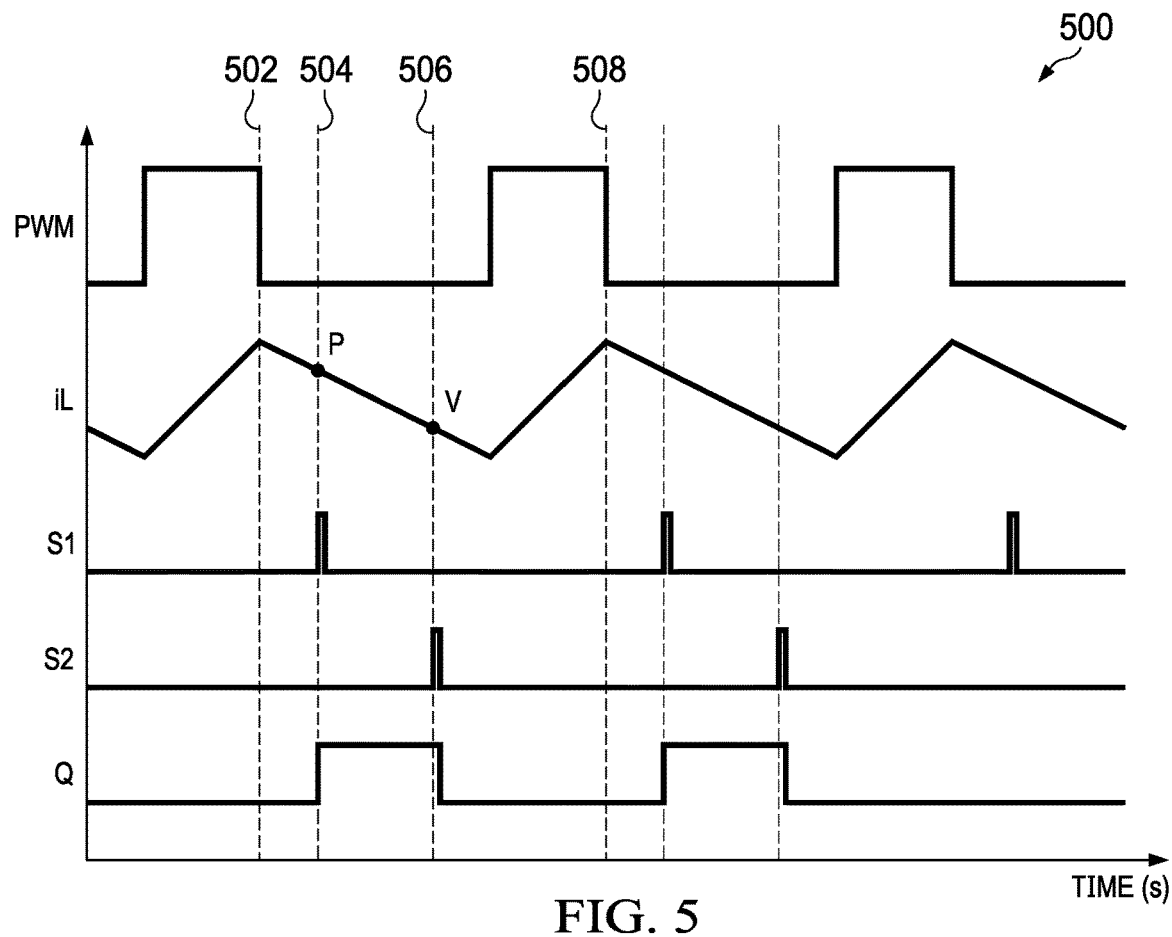
FIG. 5 is a graph of waveforms that demonstrate operation of the system of FIG. 4 in various examples.

FIG. 5 is a graph 500 of waveforms that demonstrate an example operation of the system 400 of FIG. 4 as a function of time. In the graph 500, the PWM waveform corresponds to VPWM that is provided as output by the PWM comparator 118. The iL waveform corresponds to current through the inductor 406 (or an indication thereof, such as a voltage across the sense resistor 410), which is provided to the first SH circuit 412 and the second SH circuit 414. The S1 waveform corresponds to the S1 output of the timing circuit 416, while the S2 waveform corresponds to the S2 output of the timing circuit 416. Finally, the Q waveform corresponds to the Q output of the SR latch 422, and thus also represents the inverse of the $\overline{Q}$ output of the SR latch 422.

In the example of FIGS. 4 and 5, in which a PCM control scheme is implemented, the timing circuit 416 is configured to provide a voltage pulse on the S1 output responsive to the inductor 406 current decreasing, such as following the high-side power FET 402 turning off responsive to the PWM comparator 118 output VPWM being deasserted (e.g., at time 502). In this example, the voltage pulse on the S1 output occurs at time 504, after time 502. The timing circuit 416 is configured to then provide a voltage pulse on the S2 output after a period of time has elapsed (e.g., at time 506) after providing the voltage pulse on the S1 output. For example, the period of time is designed to be less than the OFF time for the high-side power FET 402, and thus the voltage pulse on the S2 output occurs while the inductor 406 current is still decreasing. The above process repeats at time 508, when the high-side power FET 402 again turns off responsive to the PWM comparator 118 output VWPM being deasserted.

In another example in which a VCM control scheme is implemented, the timing circuit 416 is configured to provide a voltage pulse on the S1 output responsive to the inductor 406 current increasing, such as following the high-side power FET 402 turning on responsive to the PWM comparator 118 output VPWM being asserted. The timing circuit 416 is configured to then provide a voltage pulse on the S2 output after a period of time has elapsed after providing the voltage pulse on the S1 output. For example, the period of time between time 504 and time 506 is designed to be less than the ON time for the high-side power FET 402, and thus the voltage pulse on the S2 output occurs while the inductor 406 current is still increasing.

Referring to the PCM control example of FIGS. 4 and 5, at time 504, the timing circuit 416 provides a voltage pulse on the S1 output. Accordingly, the first SH circuit 412 samples the inductor 406 current (e.g., the voltage across the sense resistor 410) and provides the sampled voltage (P) as its output. The switch 428 closes during the S1 pulse, which discharges the replica capacitor 426, and opens following the S1 pulse, which allows the replica capacitor 426 to be charged by the replica current source 424. Also responsive to the voltage pulse on the S1 output, the Q output of the SR latch 422 is asserted. Accordingly, the inputs to the analog integrator circuit 304 are coupled through the switch 434, which effectively resets the analog integrator circuit 304 and/or the transconductance amplifier 438.

At time 506, the timing circuit 416 provides a voltage pulse on the S2 output. Accordingly, the second SH circuit 414 samples the inductor 406 current (e.g., the voltage across the sense resistor 410) and provides the sampled voltage (V) as its output. Also responsive to the voltage pulse on the S2 output, the SR latch 422 is reset (e.g., the $\overline{Q}$ output is asserted). Accordingly, the switch 434 is open, and the switches 430, 432 are closed. The analog integrator circuit 304 thus receives (e.g., through the now-closed switches 430, 432) an indication of the rate of change of the inductor 406 current from the differential amplifier 420 output, which is proportional to P-V. The analog integrator circuit 304 also receives an indication of the rate of change of VRAMP as the voltage across the replica capacitor 426.

The transconductance amplifier 438 charges or discharges the integrating capacitor 440 with a current proportional to the difference between the inputs to the analog integrator circuit 304. As described above, the analog integrator circuit 304 is configured to compare the rate of change of the falling inductor 406 current (e.g., M2, indicated by P-V and the time between time 504 and time 506) to the rate of change of VRAMP (e.g., M3, indicated by the voltage across replica capacitor 426). The analog integrator circuit 304 is configured to cause the ramp generator 116 to increase an absolute value of the rate of change of VRAMP, or M3, responsive to a ratio of M2 to M3 being greater than a threshold value, which indicates that the rate of change of VRAMP is less than specified for a given application (e.g., M3 is shallower relative to M2 than specified). For example, responsive to the output of the differential amplifier 420 being greater than the voltage across the replica capacitor 426, the transconductance amplifier 438 provides current to the integrating capacitor 440, increasing the voltage across the integrating capacitor 440. Accordingly, the voltage-controlled current source 442 provides an increased current that, in combination with the current from the replica current source 424, is mirrored through current mirror 444 to the ramp generator 116, increasing the slope of VRAMP.

Similarly, the analog integrator circuit 304 is configured to cause the ramp generator 116 to decrease the absolute value of the rate of change of VRAMP, or M3, responsive to a ratio of M2 to M3 being less than the threshold value, which indicates that the rate of change of VRAMP is greater than specified for a given application (e.g., M3 is steeper relative to M2 than specified). For example, responsive to the output of the differential amplifier 420 being less than the voltage across the replica capacitor 426, the transconductance amplifier 438 sinks current from the integrating capacitor 440, decreasing the voltage across the integrating capacitor 440. Accordingly, the voltage-controlled current source 442 provides a decreased current that, in combination with the current from the replica current source 424, is mirrored through current mirror 444 to the ramp generator 116, decreasing the slope of VRAMP.

The particular threshold to which the ratio of M2 (or M1, in the VCM control example) to M3 is compared is dependent on a gain implemented by one or more of the circuit elements of FIG. 4. For example, the implemented gain is influenced at least by the value of the sense resistor 410, the differential amplifier 420 gain, the transconductance amplifier 438 gain, the voltage-controlled current source 442 gain, and the current mirror 444 gain (e.g., mirroring current at a ratio of N:1). By adjusting the values of some or all of these circuit elements, the threshold (e.g., a representation of the programmed relationship between M1 (or M2) and M3) is also adjusted. In an example, the gain implemented by one or more of the circuit elements described above is configurable responsive to a user input. For example, the ratio N:1 of the current mirror 444 is a programmable gain value. Responsive to receiving a first user input that corresponds to a first threshold (e.g., programmed relationship between M1 (or M2) and M3), the current mirror 444 provides a first gain (e.g., mirrors current at a first ratio). Responsive to receiving a second user input that corresponds to a second threshold, the current mirror 444 provides a second gain (e.g., mirrors current at a second ratio). In other examples, various other gain values are similarly programmable. Unless explicitly stated, examples described herein are not limited to a particular threshold or relationship between the rates of change of inductor 406 current and VRAMP.

In another example, the gain implemented by the circuit elements described above is variable responsive to the values of VIN and/or VOUT. In some cases, it is useful to utilize different thresholds (e.g., programmed relationships between M1 (or M2) and M3) for different values of, or relationships between, VIN and VOUT. For example, when VIN and VOUT have a first relationship, it is useful to implement a threshold that results in controlling M3=M2. However, when VIN and VOUT have a second relationship, it is useful to implement a threshold that results in controlling M3=0.65*M2. In one example, a look-up table or other storage mechanism relates values of VIN and VOUT with a corresponding threshold value. The slope compensator circuit 114 is configured to determine, responsive to the values of VIN and VOUT, the associated threshold to be implemented in controlling M3. For example, the slope compensator circuit 114 is configured to implement a first threshold in controlling M3, responsive to the relationship between VIN and VOUT being a first relationship. The slope compensator circuit 114 is configured to implement a second threshold in controlling M3, responsive to the relationship between VIN and VOUT being a second relationship.

In a VCM control example, the functionality of FIGS. 1, 3 and 4 is generally as described above, with the following changes. The subtractor 110 is replaced with an adder, and thus the compensation ramp (VSC) is the command voltage (VCMD) from the control loop 108 plus VRAMP from the ramp generator 116. The PWM comparator 118 is configured to assert VPWM responsive to the sensed inductor 406 current (e.g., iL×Ri from the inductor 406 current sense circuit 112) being less than VSC. Responsive to the timing circuit 416 providing a voltage pulse on the S1 output (e.g., at a first time t1), the first SH circuit 412 samples the inductor 406 current (e.g., the voltage across the sense resistor 410) and provides the sampled voltage (which is V, rather than P) as its output. Responsive to the timing circuit 416 providing a voltage pulse on the S2 output (e.g., at a second time t2), the second SH circuit 414 samples the inductor 406 current (e.g., the voltage across the sense resistor 410), which is still increasing as described above with respect to the VCM control example described with respect to FIG. 5. Accordingly, the second SH circuit 414 provides the sampled voltage (which is P, rather than V) as its output. In the VCM control example, the inputs of the differential amplifier 420 are switched, and the output of the differential amplifier 420 is still proportional to P-V.

Figure 6:
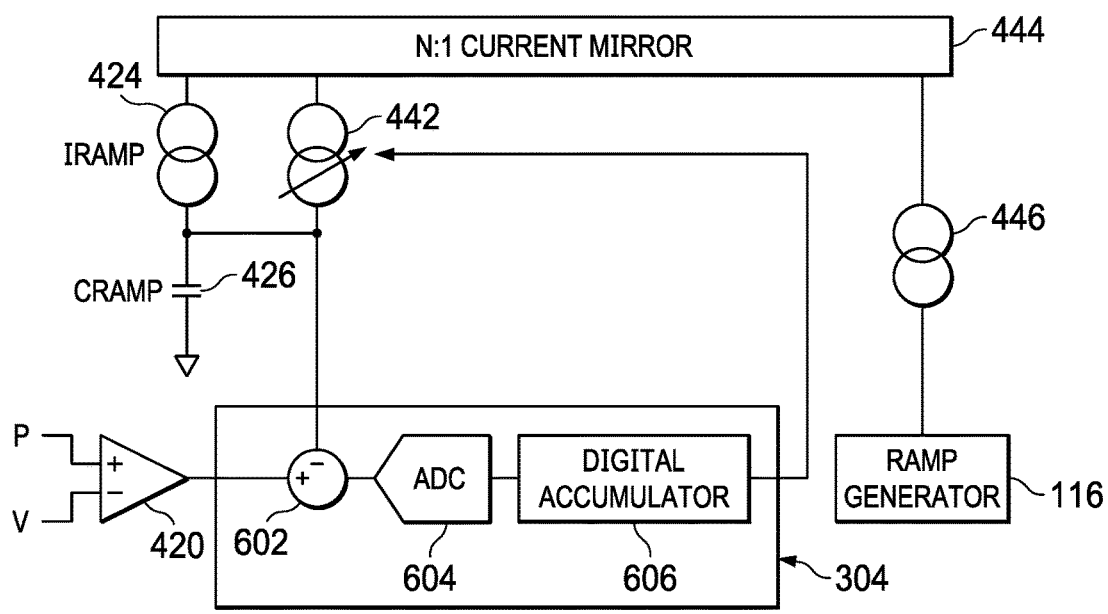
FIG. 6 is a schematic diagram of a system including a digital integrator circuit in various examples.

FIG. 6 is a schematic diagram of a system including a digital integrator circuit 304 in various examples. The system of FIG. 6 includes certain same elements as the system 400, although the system of FIG. 6 is simplified relative to the system 400 for brevity. For example, the differential amplifier 420 provides as its output a voltage proportional to P-V (e.g., inductor 406 current at first and second times) to the digital integrator circuit 304. The replica current source 424 and the replica capacitor 426 function as described above. The SR latch 422 and switches 428, 430, 432, and 434 are not included for simplicity, but provide functionality similar to as described above. An output of the digital integrator circuit 304 is provided to control the controlled current source 442, which is a digitally-controlled current source 442 in the example of FIG. 6. For example, the output of the digital integrator circuit 304 is provided to a control terminal of the digitally-controlled current source 442. The replica current source 424 and the digitally-controlled current source 442 are coupled as inputs to a current mirror 444. For example, the sum of the currents provided by the replica current source 424 and the digitally-controlled current source 442 is mirrored at an output of the current mirror 444, which is represented as output current source 446. The output current source 446 is coupled to the ramp generator 116. Accordingly, responsive to the digitally-controlled current source 442 providing current to (or sinking current from) the compensation ramp node, a corresponding current is provided to (or sunk from) the ramp generator 116 to alter the slope of VRAMP provided by the ramp generator 116.

In the example of FIG. 6, the digital integrator circuit 304 includes an analog subtractor 602 that has a non-inverting terminal configured to receive the indication of the rate of change of the inductor 406 current from the differential amplifier 420. The subtractor 602 also has an inverting terminal configured to receive the indication of the rate of change of VRAMP (e.g., the voltage across replica capacitor 426). The subtractor 602 is thus configured to provide a voltage at its output that is proportional to a difference between the rate of change of the inductor 406 current and the rate of change of VRAMP. The subtractor 602 output voltage is thus indicative of a comparison of its inputs.

The digital integrator circuit 304 also includes an analog-to-digital converter (ADC) 604, having an input coupled to the subtractor 602 output. The ADC 604 is configured to provide as its output a digital value that corresponds to the ADC 604 input, or the subtractor 602 output. The ADC 604 output is thus a digital value indicative of the comparison between the rate of change of the inductor 406 current and the rate of change of VRAMP.

The digital integrator circuit 304 also includes a digital accumulator 606, having an input coupled to the ADC 604 output. The digital accumulator 606 provides an integrating function in the digital domain, similar to the integrating capacitor 440 in the analog domain, described above. For example, responsive to the output of the ADC 604 being a positive value, the digital accumulator 606 value provided as its output increases. Responsive to the output of the ADC 604 being a negative value, the digital accumulator 606 value provided as its output decreases. A current provided (or sunk) by the digitally-controlled current source 442 is proportional to the digital accumulator 606 value. Accordingly, responsive to the digitally-controlled current source 442 providing current to (or sinking current from) the compensation ramp node, a corresponding current is provided to (or sunk from) the ramp generator 116 to alter the slope of VRAMP provided by the ramp generator 116, as described above.

Figure 7:
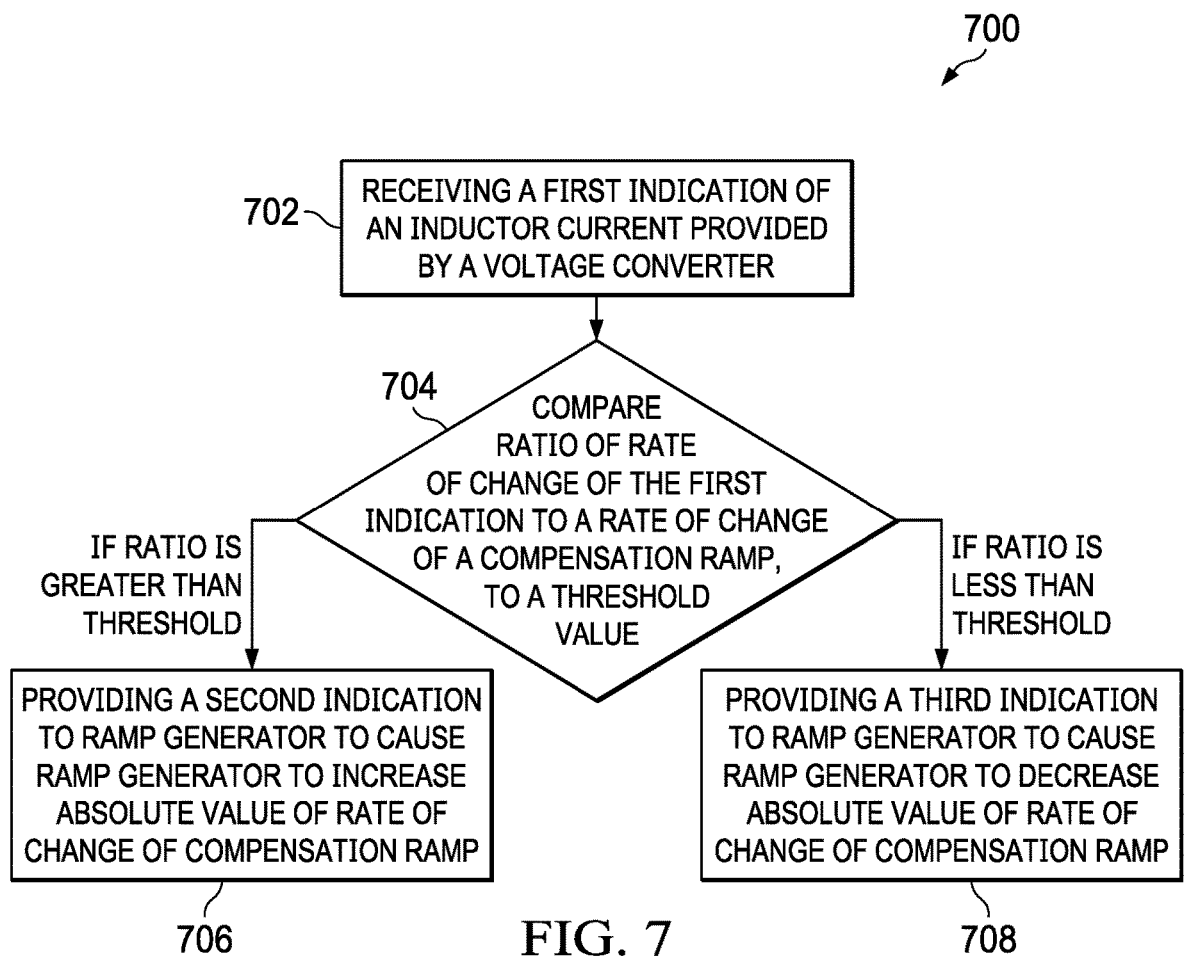
FIG. 7 is a flow chart of a method of slope compensation in various examples.

FIG. 7 is a flow chart of a method 700 of slope compensation, implemented by a slope compensator circuit 114 in some examples. The method 700 begins in block 702 with receiving a first indication of an inductor 406 current provided by a voltage converter 102. For example, the indication of the inductor 406 current is a voltage across the sense resistor 410, which is proportional to the current through the inductor 406 (e.g., iL×Ri). In this example, the SH circuit 302 receives the indication of the inductor 406 current from the sense resistor 410, or the inductor current sense circuit 112.

The method 700 continues in block 704 with comparing a ratio of a rate of change of the first indication (e.g., M2 or M1) to a rate of change of a compensation ramp (e.g., M3) to a threshold value. For example, the first SH circuit 412 and second SH circuit 414 (of the SH circuit 302) provide an indication of the rate of change of the inductor 406 current because the first SH circuit 412 samples and provides as its output the inductor 406 current at t1 (e.g., responsive to S1), and the second SH circuit 414 samples and provides as its output the inductor 406 current at t2 (e.g., responsive to S2). Also, the output of the differential amplifier 420 is an indication of the rate of change of the inductor 406 current when the time period between t1 and t2 is considered. The voltage across the replica capacitor 426 (e.g., the voltage at a compensation ramp node between the replica capacitor 426 and the replica current source 424) over time indicates a rate of change of VRAMP provided by the ramp generator 116.

The particular threshold to which the ratio of M2 (or M1, in the VCM control example) to M3 is compared is dependent on a gain implemented by one or more of the circuit elements of FIG. 4. For example, the implemented gain is influenced at least by the value of the sense resistor 410, the differential amplifier 420 gain, the transconductance amplifier 438 gain, the voltage-controlled current source 442 gain, and the current mirror 444 gain (e.g., mirroring current at a ratio of N:1). By adjusting the values of some or all of these circuit elements, the threshold (e.g., a representation of the programmed relationship between M1 (or M2) and M3) is also adjusted.

Responsive to the ratio being greater than the threshold in step 704, the method 700 continues in block 706 with providing a second indication to the ramp generator 116. The second indication causes the ramp generator 116 to increase an absolute value of the rate of change of the compensation ramp. For example, responsive to the output of the differential amplifier 420 being greater than the voltage across the replica capacitor 426, the integrator circuit 304 causes the voltage-controlled current source 442 to provide an increased current that, in combination with the current from the replica current source 424, is mirrored through current mirror 444 to the ramp generator 116, increasing the slope of VRAMP.

Responsive to the ratio being less than the threshold in step 704, the method 700 continues in block 708 with providing a third indication to the ramp generator 116. The third indication causes the ramp generator 116 to decrease the absolute value of the rate of change of the compensation ramp. For example, responsive to the output of the differential amplifier 420 being less than the voltage across the replica capacitor 426, the integrator circuit 304 causes the voltage-controlled current source 442 to provide a decreased current that, in combination with the current from the replica current source 424, is mirrored through current mirror 444 to the ramp generator 116, decreasing the slope of VRAMP.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. An apparatus comprising:
 a slope control circuit having a slope control input and a slope control output, the slope control input coupled to a current sense terminal, the slope control circuit configured to provide a control signal at the slope control output, the control signal indicative of a rate of a current sensed at the current sense terminal; and a ramp generator having a ramp output and a ramp rate control input, the ramp rate control input coupled to the slope control output, and the ramp generator configured to set a slope of a ramp signal at the ramp output responsive to the control signal.

2. The apparatus of claim 1, wherein the ramp generator includes a current source coupled between a voltage terminal and the ramp output and a capacitor coupled between the ramp output and a ground terminal, the current source having a control input coupled to the ramp rate control input.

3. The apparatus of claim 1, wherein the slope control input is a first slope control input, and the slope control circuit has a second slope control input coupled to the ramp output.

4. The apparatus of claim 1, wherein the current sense terminal is a power converter current sense terminal.

5. The apparatus of claim 2, wherein the ramp generator is a first ramp generator, the ramp output is a first ramp output, and the current source is a first current source; and wherein the apparatus further comprises:
  a current mirror having a first current terminal and a second current terminal, the first current terminal coupled to the first current source;
  a second ramp generator having a second ramp output and a ramp current input; and
  a second current source coupled between the second current terminal and the ramp current input.

6. The apparatus of claim 5, wherein the current mirror is configured to receive a first current at the first current terminal, and provide a second current at the second current terminal based on scaling up the first current with a gain.

7. The apparatus of claim 6, wherein the slope control input is a first slope control input, the slope control circuit has a second slope control input coupled to the ramp output, and the slope control circuit is configured to:
  receive a current sense signal at the first slope control input;
  receive a voltage ramp signal at the second slope control input;
  responsive a ratio between a slope of the current sense signal and a slope of the voltage ramp signal being above a threshold, provide a first signal at the slope control output to increase the slope of the voltage ramp signal; and
  responsive to the ratio being below the threshold, provide a second signal at the slope control output to decrease the slope of the voltage ramp signal; and
  wherein the gain is based on the threshold.

8. The apparatus of claim 6, wherein the current mirror has a gain control input, and the current mirror is configured to set the gain based on a state of the gain control input.

9. The apparatus of claim 8, further comprising a gain control circuit having a first input, a second input, and a gain control output, the first input coupled to a power converter voltage input terminal, and the second input coupled to a power converter voltage output.

10. The apparatus of claim 3, wherein the slope control circuit includes a rate measurement circuit coupled between the slope control input and the slope control output and configured to provide the control signal, and wherein the rate measurement circuit comprises:
  a timing circuit having a first timing output and a second timing output;
  a first sample and hold (SH) circuit having a first data input, a first data output, and a first timing input, the first data input coupled to the first slope control input, and the first timing input coupled to the first timing output;
  a second sample and hold (SH) circuit having a second data input, a second data output, and a second timing input, the second data input coupled to the first slope control input, and the second timing input coupled to the second timing output; and
  an amplifier having a first amplifier input, a second amplifier input, and an amplifier output, the first amplifier input coupled to the first data output, the second amplifier input coupled to the second data output, and the amplifier output coupled to the slope control output.

11. The apparatus of claim 10, wherein the timing circuit is configured to provide a first voltage pulse at the first timing output and a second voltage pulse at the second timing output, the second voltage pulse being separated from the first voltage pulse by an interval.

12. The apparatus of claim 10, wherein the slope control circuit includes an integrator having a first integrator input, a second integrator input, and an integrator output, the first integrator input coupled to the amplifier output, the second integrator input coupled to the second slope control input, and the integrator output coupled to the slope control output.

13. The apparatus of claim 12, wherein the slope control circuit further includes:
  a first switch coupled between the amplifier output and the first integrator input, the first switch having a first switch control terminal;
  a second switch coupled between the first and second integrator inputs, the second switch having a second switch control terminal;
  a third switch coupled between the second slope control input and the second integrator input, the third switch having a third switch control terminal; and
  a latch circuit having a reset input, a set input, a first latch output, and a second latch output, the set input coupled to the first timing output, the reset input coupled to the second timing output, the first latch output coupled to first switch control terminal and the third switch control terminal, and the second latch output coupled to the second switch control terminal.

14. The apparatus of claim 13, wherein the ramp generator includes a fourth switch coupled between the ramp output and a ground terminal, the fourth switch having a fourth switch control terminal coupled to the first timing output.

15. The apparatus of claim 10, wherein the slope control circuit includes:
  a subtractor circuit having first subtractor input, a second subtractor input, and a subtractor output, the first subtractor input coupled to the amplifier output, and the second subtractor input coupled to the second slope control input; and
  an accumulator circuit coupled between the subtractor output and the slope control output.

16. The apparatus of claim 15, wherein the accumulator circuit is a digital accumulator circuit, and the slope control circuit includes an analog-to-digital converter (ADC) coupled between the subtractor output and the slope control output.

17. The apparatus of claim 5, further comprising:
  a subtractor circuit having a first subtractor input, a second subtractor input, and a subtractor output, the first subtractor input coupled to a power converter feedback input, and the second subtractor input coupled to the second ramp output;

a comparator having a first comparator input, a second comparator input, and a comparator output, the first comparator input coupled to the subtractor output, and the second comparator input coupled to the current sense terminal; and a power stage having a power stage input and a power stage output, the power stage input coupled to the comparator output.

18. The apparatus of claim 5, further comprising:

an adder circuit having a first adder input, a second adder input, and an adder output, the first adder input coupled to a power converter feedback input, and the second adder input coupled to the second ramp output;

a comparator having a first comparator input, a second comparator input, and a comparator output, the first comparator input coupled to the adder output, and the second comparator input coupled to the current sense terminal; and a power stage having a power stage input and a power stage output, the power stage input coupled to the comparator output.

19. A system comprising:

a power stage coupled between a power input and a reference terminal, the power stage having a power stage input and a power stage output;

an inductor coupled between the power stage output and a power output;

a current sense circuit coupled to the inductor, the current sense circuit having a current sense output;

a comparator having a first comparator input, a second comparator input, and a comparator output, the first comparator input coupled to the current sense output, and the comparator output coupled to the power stage input;

a first ramp generator including a first current source coupled between a voltage terminal and a first ramp output and a capacitor coupled between the first ramp output and a ground terminal, the first current source having a control input;

a current mirror having a first current terminal and a second current terminal, the first current terminal coupled to the first current source;

a second ramp generator having a second ramp output and a ramp current input;

a second current source coupled between the second current terminal and the ramp current input; and a slope control circuit having a slope control input and a slope control output, the slope control input coupled to the current sense output, and the slope control output coupled to the control input.

20. The system of claim 19, further comprising a signal combiner circuit having a first input, a second input, and an output, the first input coupled to the power output, the second input coupled to the second ramp output, and the output coupled to the second comparator input.

21. The system of claim 19, wherein the slope control input is a first slope control input, the slope control circuit has a second slope control input coupled to the first ramp output.

22. The system of claim 19, wherein the current mirror has a gain control input, and the system further comprises a gain control circuit having a first input, a second input, and a gain control output, the first input coupled to the power input, and the second input coupled to the power output.

23. A method comprising:

receiving a first signal representing a current of a power converter;

receiving a second signal representing a compensation ramp signal provided to the power converter;

based on the first and second signals, determining a ratio between a slope of the current and a slope of the compensation ramp signal;

responsive to the ratio being above a threshold, increasing the slope of the compensation ramp signal; and responsive to the ratio being below the threshold, decreasing the slope of the compensation ramp signal.

24. The method of claim 23, further comprising: determining the threshold is based on an input voltage of the power converter and an output voltage of the power converter.

* * * * *